(12) United States Patent
Park et al.

(10) Patent No.: US 7,397,317 B2
(45) Date of Patent: Jul. 8, 2008

(54) QUADRATURE SIGNAL GENERATOR FOR TUNING PHASES OF ALL OF FOUR GENERATED QUADRATURE SIGNALS

(75) Inventors: Eun-chul Park, Yongin-si (KR); Chun-deok Suh, Yongin-si (KR); Choong-yul Cha, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 53 days.

(21) Appl. No.: 11/344,061

(22) Filed: Feb. 1, 2006

(65) Prior Publication Data
US 2006/0170507 A1    Aug. 3, 2006

(30) Foreign Application Priority Data
Feb. 1, 2005    (KR)    ............ 10-2005-0009082

(51) Int. Cl.
*H03H 11/16*    (2006.01)

(52) U.S. Cl. ..................... 331/137; 331/45

(58) Field of Classification Search ............ 331/137, 331/45, 135, 108 B
See application file for complete search history.

(56) References Cited

U.S. PATENT DOCUMENTS

| | | | | |
|---|---|---|---|---|
| 6,226,509 | B1 * | 5/2001 | Mole et al. ............ | 455/302 |
| 6,388,543 | B1 * | 5/2002 | Molnar et al. .......... | 333/172 |
| 6,529,100 | B1 * | 3/2003 | Okanobu ............... | 333/172 |
| 6,768,364 | B2 * | 7/2004 | Wang .................... | 327/254 |

* cited by examiner

*Primary Examiner*—Joseph Chang
(74) *Attorney, Agent, or Firm*—Sughrue Mion, PLLC

(57) ABSTRACT

A quadrature signal generator capable of phase-tuning with respect to all of four generated quadrature signals. The quadrature signal generator includes four phase tuning units each having two input terminals, one receiving a differential signal, the other being grounded, and changing a phase of the differential signal to thereby generate quadrature signals. Accordingly, it is possible to tune phases of all the four generated quadrature signals. It is also possible to prevent the amplitude of quadrature signals from being deviated from a reference value.

9 Claims, 6 Drawing Sheets

QUADRATURE SIGNAL GENERATOR FOR TUNING PHASES OF ALL OF FOUR GENERATED QUADRATURE SIGNALS

CROSS REFERENCE TO RELATED APPLICATION

This application claims the benefit under 35 U.S.C. § 119 from Korean Patent Application No. 2005-09082, filed on Feb. 1, 2005, in the Korean Intellectual Property Office, the entire contents of which are incorporated herein by reference.

BACKGROUND OF THE INVENTION

1. Field of the Invention

The present invention relates to a quadrature signal generator, and more particularly, to a quadrature signal generator which is capable of phase-tuning with respect to all of four generated quadrature signals.

2. Description of the Related Art

A quadrature signal generator generates four quadrature signals using two differential signals generated by a local oscillator. The quadrature signal generator is called "poly phase filter" (PPF).

The quadrature signal generator is provided with phase tuners. The phase tuner generates a quadrature signal by changing a phase of an incoming differential signal. The quadrature signal generator includes four phase tuners. Since the respective phase turners generate quadrature signals of different phases, the quadrature signal generator outputs four quadrature signals.

The phase tuner typically includes two input terminals to receive a homogenous differential or a heterogeneous differential signal, respectively.

However, if the homogeneous differential signals are input to each input terminal, it is impossible to tune phases of the quadrature signals. Also, if the heterogeneous differential signals are input to all of the two input terminals of the phase tuner, the amplitude of the quadrature signal is deviated from a reference value due to a signal unbalance occurring during the phase tuning process.

SUMMARY OF THE INVENTION

The present invention provides a quadrature generator which is capable of phase-tuning with respect to all of four generated quadrature signals.

According to an aspect of the present invention, there is provided a quadrature signal generator generates first, second, third, and fourth quadrature signals using first and second differential signals. The quadrature signal generator comprises a first phase tuning unit having two input terminals, one receiving the first differential signal, the other being grounded, the first phase tuning unit changing a phase of the first differential signal to thereby generate the first quadrature signal, a second phase tuning unit having two input terminals, one receiving the second differential signal, the other being grounded, the second phase tuning unit changing a phase of the second differential signal to thereby generate the second quadrature signal, a third phase tuning unit having two input terminals, one receiving the second differential signal, the other being grounded, the third phase tuning unit changing the phase of the second differential signal to thereby generate the third quadrature signal, and a fourth phase tuning unit having two input terminals, one receiving the first differential signal, the other being grounded, the fourth phase tuning unit changing the phase of the first differential signal to thereby generate the fourth quadrature signal.

Preferably, but not necessarily, the first phase tuning unit comprises: a first resistor connected between the input terminal receiving the first differential signal and an output terminal outputting the first quadrature signal; and a first variable capacitance element connected between the grounded input terminal and the output terminal outputting the first quadrature signal, the second phase tuning unit comprises: a second resistor connected between the grounded input terminal and an output terminal outputting the second quadrature signal; and a second variable capacitance element connected between the input terminal receiving the second differential signal and the output terminal outputting the second quadrature signal, the third phase tuning unit comprises: a third resistor connected between the input terminal receiving the second differential signal and an output terminal outputting the third quadrature signal; and a third variable capacitance element connected between the grounded input terminal and the output terminal outputting the third quadrature signal, and the fourth phase tuning unit comprises: a fourth resistor connected between the grounded input terminal and an output terminal outputting the fourth quadrature signal; and a fourth variable capacitance element connected between the input terminal receiving the first differential signal and the output terminal outputting the fourth quadrature signal.

Preferably, but not necessarily, the first, the second, the third and the fourth variable capacitance elements each are one of a variable capacitor and a varacter.

Preferably, but not necessarily, the output terminals of the first, the second, the third and the fourth phase tuning units are connected to direct current signal blocking elements, respectively.

According to another aspect of the present invention, there is provided a quadrature signal generator generates first, second, third and fourth quadrature signals using first and second differential signals, and generates fifth, sixth, seventh and eighth quadrature signals using the first, the second, the third and the fourth quadrature signals. The quadrature signal generator comprises a first phase shift unit having two input terminals, one receiving the first differential signal, the other being grounded, the first phase shift unit changing a phase of the first differential signal to thereby generate the first quadrature signal, a second phase shift unit having two input terminals, one receiving the second differential signal, the other being grounded, the second phase shift unit changing a phase of the second differential signal to thereby generate the second quadrature signal, a third phase shift unit having two input terminals, one receiving the second differential signal, the other being grounded, the third phase shift unit changing the phase of the second differential signal to thereby generate the third quadrature signal, a fourth phase shift unit having two input terminals, one receiving the first differential signal, the other being grounded, the fourth phase shift unit changing the phase of the first differential signal to thereby generate the fourth quadrature signal, a first phase tuning unit having two input terminals, one receiving the first quadrature signal and the other receiving the second quadrature signal, the first phase tuning unit changing phases of the first and the second quadrature signals to thereby generate the fifth quadrature signal, a second phase tuning unit having two input terminals, one receiving the second quadrature signal and the other receiving the third quadrature signal, the second phase tuning unit changing phases of the second and the third quadrature signals to thereby generate the sixth quadrature signal, a third phase tuning unit having two input terminals, one receiving the third quadrature signal and the other receiving the fourth quadrature signal, the third phase tuning unit changing phases of the third and the fourth quadrature signals to thereby generate the seventh quadrature signal, and a fourth phase tuning unit having two input terminals, one receiving the fourth quadrature signal and the other receiving the first quadrature signal, the fourth phase tuning unit changing phases of the fourth and the first quadrature signals to thereby generate the eighth quadrature signal.

Preferably, but not necessarily, the first phase shift unit comprises: a first resistor connected between the input terminal receiving the first differential signal and an output terminal outputting the first quadrature signal; and a first capacitor connected between the grounded input terminal and the output terminal outputting the first quadrature signal, the second phase shift unit comprises: a second resistor connected between the grounded input terminal and an output terminal outputting the second quadrature signal; and a second capacitor connected between the input terminal receiving the second differential signal and the output terminal outputting the second quadrature signal, the third phase shift unit comprises: a third resistor connected between the input terminal receiving the second differential signal and an output terminal outputting the third quadrature signal; and a third capacitor connected between the grounded input terminal and the output terminal outputting the third quadrature signal, and the fourth phase shift unit comprises: a fourth resistor connected between the grounded input terminal and an output terminal outputting the fourth quadrature signal; and a fourth capacitor connected between the input terminal receiving the first differential signal and the output terminal outputting the fourth quadrature signal.

Preferably, but not necessarily, the first phase tuning unit comprises: a fifth resistor connected between the input terminal receiving the first quadrature signal and an output terminal outputting the fifth quadrature signal; and a first variable capacitance element connected between the input terminal receiving the second quadrature signal and the output terminal outputting the fifth quadrature signal, the second phase tuning unit comprises: a sixth resistor connected between the input terminal receiving the second quadrature signal and an output terminal outputting the sixth quadrature signal; and a second variable capacitance element connected between the input terminal receiving the third quadrature signal and the output terminal outputting the sixth quadrature signal, the third phase tuning unit comprises: a seventh resistor connected between the input terminal receiving the third quadrature signal and an output terminal outputting the seventh quadrature signal; and a third variable capacitance element connected between the input terminal receiving the fourth quadrature signal and the output terminal outputting the seventh quadrature signal, and the fourth phase tuning unit comprises: an eighth resistor connected between the input terminal receiving the fourth quadrature signal and an output terminal outputting the eighth quadrature signal; and a fourth variable capacitance element connected between the input terminal receiving the first quadrature signal and the output terminal outputting the eighth quadrature signal.

Preferably, but not necessarily, the first, the second, the third, and the fourth variable capacitance elements each are one of a variable capacitor and a varacter.

Preferably, but not necessarily, the output terminals of the first, the second, the third, and the fourth phase tuning units are connected to a direct current signal blocking element, respectively.

BRIEF DESCRIPTION OF THE DRAWINGS

The above and/or other aspects of the present invention become apparent by describing exemplary embodiments of the present invention in greater detail with reference to the accompanying drawings, in which.

DETAILED DESCRIPTION OF EXEMPLARY EMBODIMENTS

Hereinafter, the present invention will now be described in greater detail with reference to the accompanying drawings.

Figure 1A:
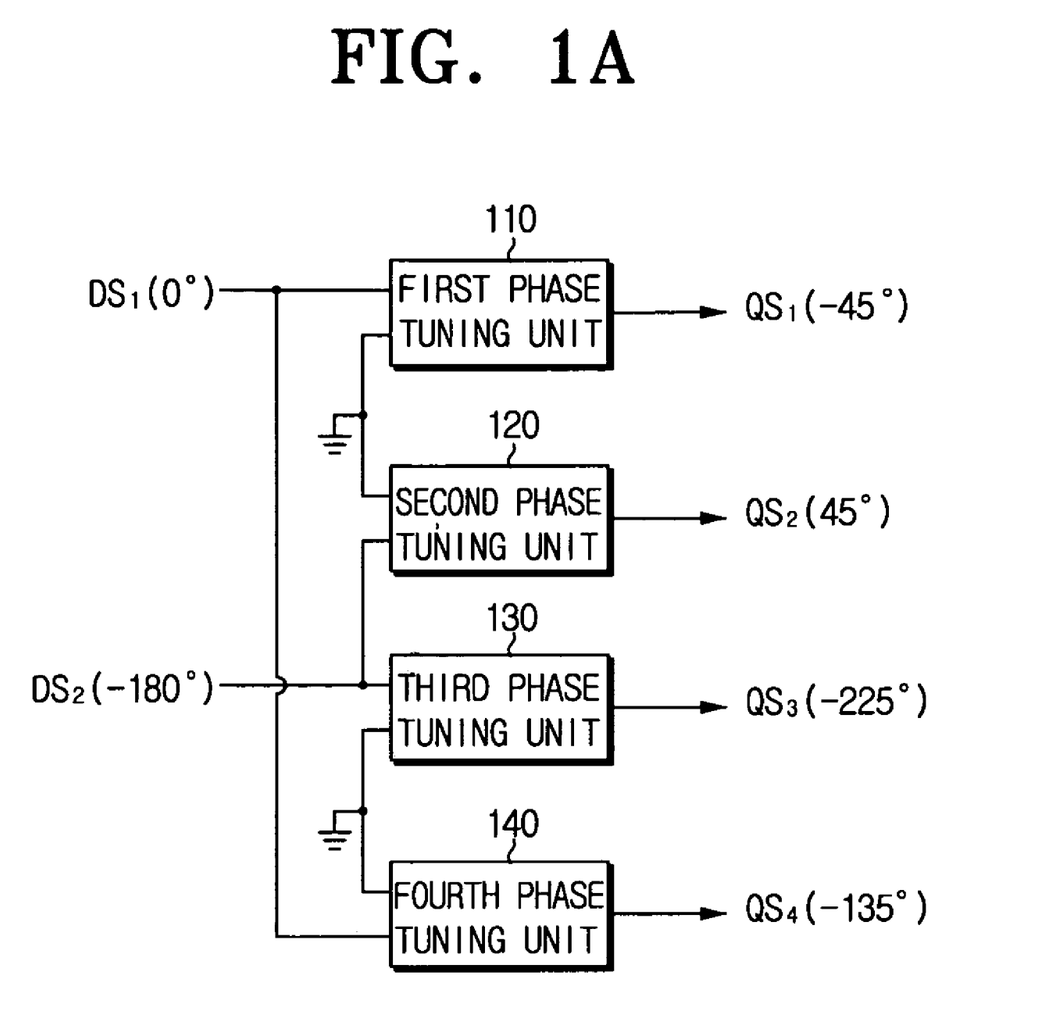
FIG. 1A is a block diagram showing a quadrature signal generator capable of phase-tuning with respect to all of four generated quadrature signals according to an exemplary embodiment of the present invention.

FIG. 1A is a block diagram showing a quadrature signal generator according to an exemplary embodiment of the present invention. The quadrature signal generator generates four quadrature signals using two differential signals generated by a local oscillator (not shown), and outputs the four quadrature signals to a mixer (not shown). According to the present invention, the quadrature signal generator is capable of phase-tuning with respect to all of the four quadrature signals.

In this exemplary embodiment, the two differential signals input to the quadrature signal generator are a first differential signal with phase 0° (referred to as $DS_1$ (0°) hereinbelow) and a second differential signal with phase −180° (referred to as $DS_2$ (−180°) hereinbelow). The four quadrature signals generated by the quadrature signal generator according to the exemplary embodiment of the present invention are a first quadrature signal with phase −45° (referred to as $QS_1$ (−45°) hereinbelow), a second quadrature signal with phase 45° (referred to as $QS_2$ (45°) hereinbelow), a third quadrature signal with phase −225° (referred to as $QS_3$ (−225°) hereinbelow), and a fourth quadrature signal with phase −135° (referred to as $QS_4$ (−135°) hereinbelow).

Referring to FIG. 1A, the quadrature signal generator comprises first to fourth phase tuning units 110 to 140.

Each phase tuning unit 110 to 140 is provided with two input terminals. One input terminal receives a differential signal and the other input terminal is grounded. A heterogeneous differential signal are input to each phase tuning unit 110 to 140. More specifically, the $DS_1$ (0°) is input to the first and the fourth phase tuning units 110, 140, whereas the $DS_2$ (−180°) is input to the second and the third phase tuning units 120, 130.

The first phase tuning unit 110 changes the phase of the $DS_1$ (0°) as much as −45°, thereby generating the $QS_1$ (−45°). The second phase tuning unit 120 changes the phase of the $DS_2$ (−180°) as much as −135°, thereby generating the $QS_2$ (45°). The third phase tuning unit 130 changes the phase of the $DS_2$ (−180°) as much as −45°, thereby generating the $QS_3$ (−225°). The fourth phase tuning unit 140 changes the phase of the $DS_1$ (0°) as much as −135°, thereby generating the $QS_4$ (−135°).

In the related art, if homogeneous differential signals are input to two input terminals of a phase tuning unit, it is impossible to tune a phase of a quadrature signal. Also, the amplitude of a quadrature signal is deviated from a reference value due to a signal unbalance occurring in the phase tuning unit. According to the exemplary embodiment of the present invention, one of the two input terminals is grounded such that only a single differential signal is input to each phase tuning unit 110 to 140. Accordingly, the above problems in the related art can be solved.

Figure 1B:
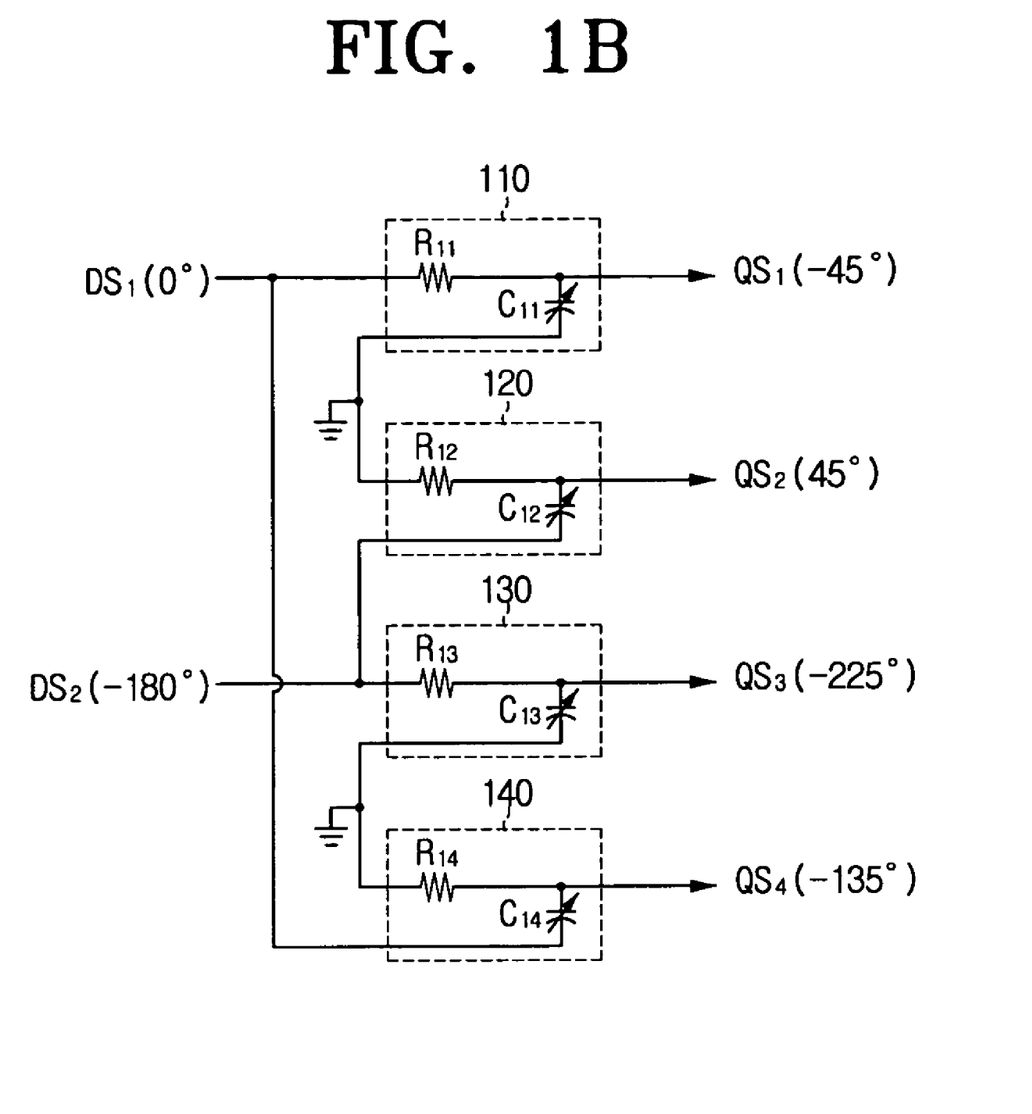
FIG. 1B is a circuit diagram showing the quadrature signal generator of FIG. 1A.

FIG. 1B is a circuit diagram showing the quadrature signal generator of FIG. 1A. Referring to FIG. 1B, each phase tuning unit 110 to 140 includes a resistor and a variable capacitor. The variable capacitor is a capacitance element that tunes a phase of an incoming differential signal. In another exemplary embodiment, a varacter is used instead of the variable capacitor. The varacter varies a capacitance according to a level of input voltage.

The first phase tuning unit 110 includes a resistor $R_{11}$ connected between a $DS_1$ (0°) input terminal and a $QS_1$ (−45°) output terminal and a variable capacitor $C_{11}$ between a grounded terminal and the $QS_1$ (−45°) output terminal. The second phase tuning unit 120 includes a resistor $R_{12}$ between a grounded terminal and a $QS_2$ (45°) output terminal and a variable capacitor $C_{12}$ between a $DS_2$ (−180°) input terminal and the $QS_2$ (45°) output terminal.

The third phase tuning unit 130 includes a resistor $R_{13}$ between a $DS_2$ (−180°) input terminal and a $QS_3$ (−225°) output terminal and a variable capacitor $C_{13}$ between a grounded terminal and the $QS_3$ (−225°) output terminal. The fourth phase tuning unit 140 includes a resistor $R_{14}$ between a grounded terminal and a $QS_4$ (−135°) output terminal and a variable capacitor $C_{14}$ between a $DS_1$ (0°) input terminal and the $QS_4$ (−135°) output terminal.

Although not shown, a capacitor for blocking a direct current signal may be connected to the output terminal of each phase tuning unit 110 to 140. This is to prevent malfunctions of phase tuning units 110 to 140 which are caused by direct current signals coming from a mixer (not shown) connected to the output terminals.

Hereinafter, a quadrature signal generator according to another exemplary embodiment of the present invention will now be described in greater detail.

Figure 2A:
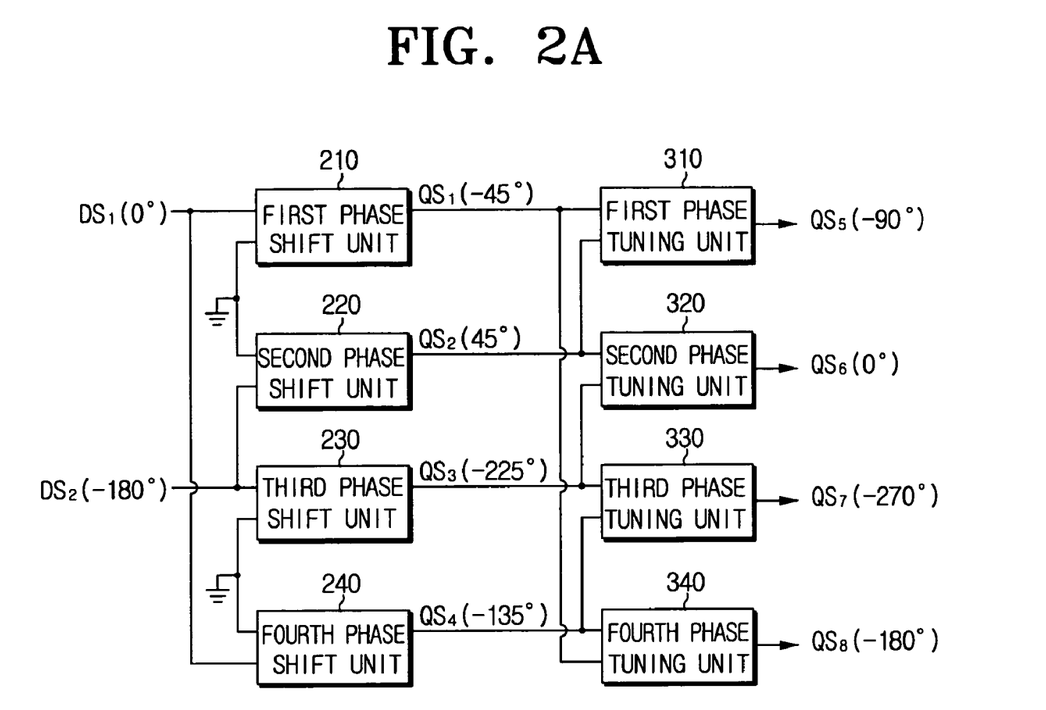
FIG. 2A is a block diagram showing a quadrature signal generator capable of phase-tuning with respect to all of four generated quadrature signals according to another exemplary embodiment of the present invention.

FIG. 2A is a block diagram showing a quadrature signal generator according to another exemplary embodiment of the present invention. The quadrature signal generator generates four initial quadrature signals using two differential signals generated by a local oscillator (not shown), and then generates another four additional quadrature signals using the four quadrature signals and outputs the four additional generated quadrature signals to a mixer (not shown). According to the present invention, the quadrature signal generator is capable of phase-tuning with respect to all of the four additional quadrature signals.

In this exemplary embodiment, the two differential signals input to the differential signal generator are $DS_1$ (0°) and $DS_2$ (−180°), respectively. The four initial quadrature signals generated by the quadrature signal generator are $QS_1$ (−45°), $QS_2$ (45°), $QS_3$ (−225°), and $QS_4$ (−135°). The four additional quadrature signals generated by the quadrature signal generator a fifth quadrature signal with phase −90° (referred to as $QS_5$ (−90°) hereinbelow), a sixth quadrature signal with phase 0° (referred to as $QS_6$ (0°) hereinbelow), a seventh quadrature signal with phase −270° (referred to as $QS_7$ (−270°) hereinbelow), and an eighth quadrature signal at −180° (referred to as $QS_8$ (−180°) hereinbelow).

Referring to FIG. 2A, the quadrature signal generator comprises first to fourth phase shift units 210 to 240 and first to fourth phase tuning units 310 to 340. The first to the fourth phase shift units 210 to 240 are connected to the first to the fourth phase tuning units 310 to 340 in series.

Each phase shift unit 210 to 240 is provided with two input terminals. One input terminal is to receive a differential signal and the other input terminal is grounded. Heterogeneous differential signals are input to each phase shift unit 210 to 240. More specifically, the $DS_1$ (0°) is input to the first and the fourth phase shift units 210, 240, whereas the $DS_2$ (−180°) is input to the second and the third phase shift units 220, 230.

The first phase shift unit 210 changes the phase of the $DS_1$ (0°) as much as −45°, thereby generating the $QS_1$ (−45°). The second phase shift unit 220 changes the phase of the $DS_2$ (−180°) as much as −135°, thereby generating the $QS_2$ (45°). The third phase shift unit 230 changes the phase of the $DS_2$ (−180°) as much as −45°, thereby generating the $QS_3$ (−225°). The fourth phase shift unit 240 changes the phase of the $DS_1$ (0°) as much as −135°, thereby generating the $QS_4$ (−135°).

Each phase tuning unit 310 to 340 is provided with two input terminals similar to the phase shift units 210 to 240. A pair of quadrature signals is input to the two input terminals. Heterogeneous quadrature signals are input to each phase tuning unit 310 to 340. More specifically, the $QS_1$ (−45°) and the $QS_2$ (45°) are input to the first phase tuning unit 310, the $QS_2$ (45°) and the $QS_3$ (−225°) are input to the second phase tuning unit 320, the $QS_3$ (−225°) and the $QS_4$ (−135°) are input to the third phase tuning unit 330, and the $QS_4$ (−135°) and the $QS_1$ (−45°) are input to the fourth phase tuning unit 340.

The first phase tuning unit 310 changes the phase of the $QS_1$ (−45°) as much as −45° and changes the phase of the $QS_2$ (45°) as much as −135°, thereby generating the $QS_5$ (−90°). The second phase tuning unit 320 changes the phase of the $QS_2$ (45°) as much as −45° and changes the phase of the $QS_3$ (−225°) as much as −135°, thereby generating the $QS_6$ (0°). The third phase tuning unit 330 changes the phase of the $QS_3$ (−225°) as much as −45° and change the phase of $QS_4$ (−135°) as much as −135°, thereby generating the $QS_7$ (−270°). The fourth phase tuning unit 340 changes the phase of the $QS_4$ (−135°) as much as −45° and changes the phase of the $QS_1$ (−45°) as much as −135°, thereby generating the $QS_8$ (−180°).

In the related art, since homogeneous differential signals are input to two input terminals of a phase tuning unit, it is impossible to tune phases of generated quadrature signals. Also, the amplitude of a quadrature signal is deviated from a reference because there occurs a signal unbalance. According to the present invention, since the two input terminals of each phase tuning unit 310 to 340 are designed to receive two quadrature signals, the above problems in the related art can be solved.

Figure 2B:
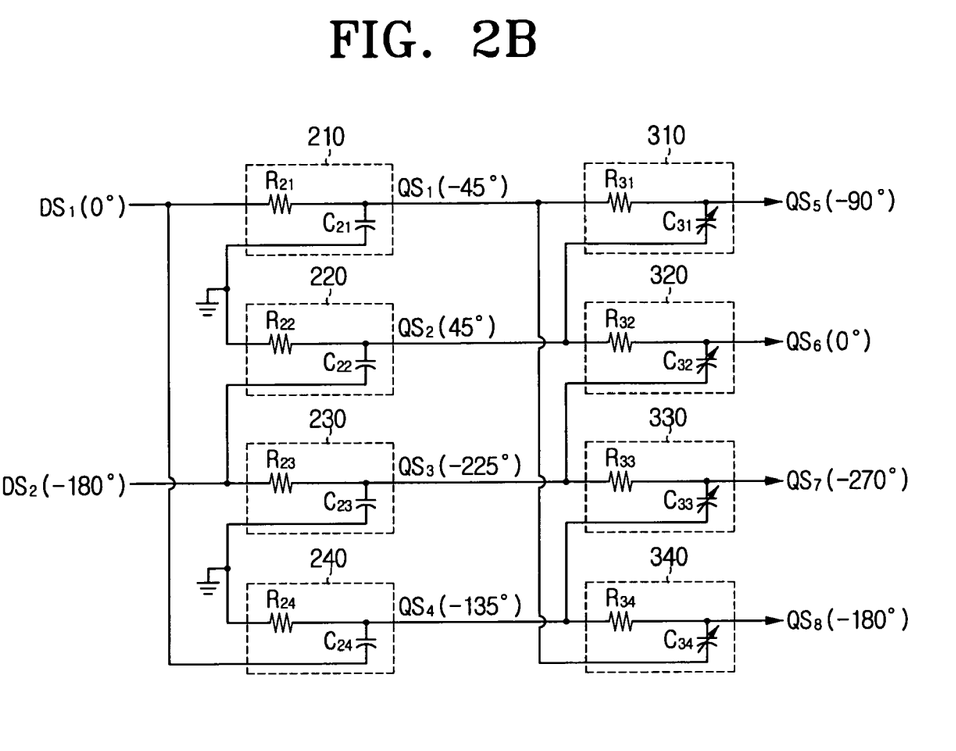
FIG. 2B is a circuit diagram showing the quadrature signal generator of FIG. 2A.

FIG. 2B is a circuit diagram of the quadrature signal generator of FIG. 2A. Referring to FIG. 2B, each phase shift unit 210 to 240 includes a resistor and a capacitor.

The first phase shift unit 210 includes a resistor $R_{21}$ connected between a $DS_1$ (0°) input terminal and a $QS_1$ (−45°) output terminal and a capacitor $C_{21}$ connected between a grounded terminal and the $QS_1$ (−45°) output terminal. The second phase shift unit 220 includes a resistor $R_{22}$ connected between a grounded terminal and a $QS_2$ (45°) output terminal and a capacitor $C_{22}$ connected between a $DS_2$ (−180°) input terminal and the $QS_2$ (45°) output terminal.

The third phase shift unit 230 includes a resistor $R_{23}$ connected between a $DS_2$ (−180°) input terminal and a $QS_3$ (−225°) output terminal and a capacitor $C_{23}$ connected between a grounded terminal and the $QS_3$ (−225°) output terminal. The fourth phase shift unit 240 includes a resistor $R_{24}$ connected between a grounded terminal and a $QS_4$ (−135°) output terminal and a capacitor $C_{24}$ connected between a $DS_1$ (0°) input terminal and the $QS_4$ (−135°) output terminal.

Referring to FIG. 2B, each phase tuning unit 310 to 340 includes a resistor and a variable capacitor. Herein, the variable capacitor is a capacitance element that is to change a phase of an incoming differential signal. In another exemplary embodiment, a varacter is used instead of the variable capacitor to vary a capacitance according to a level of input voltage.

The first phase tuning unit 310 includes a resistor $R_{31}$ connected between a $QS_1$ (−45°) input terminal and a $QS_5$ (−90°) output terminal and a variable capacitor $C_{31}$ connected between a $QS_2$ (45°) input terminal and the $QS_5$ (−90°) output terminal. The second phase tuning unit 320 includes a resistor $R_{32}$ connected between a $QS_2$ (45°) input terminal and a $QS_6$ (0°) output terminal and a variable capacitor $C_{32}$ connected between a $QS_3$ (−225°) input terminal and the $QS_6$ (0°) output terminal.

The third phase tuning unit 330 includes a resistor $R_{33}$ connected between a $QS_3$ (−225°) input terminal and a $QS_7$ (−270°) output terminal and a variable capacitor $C_{33}$ connected between a $QS_4$ (−135°) input terminal and the $QS_7$ (−270°) output terminal. The fourth phase tuning unit 340 includes a resistor $R_{34}$ connected between a $QS_4$ (−135°) input terminal and a $QS_8$ (−180°) output terminal and a variable capacitor $C_{34}$ connected between a $QS_1$ (−45°) input terminal and the $QS_8$ (−180°) output terminal.

Although not shown, a capacitor for blocking a direct current signal may be connected to the output terminals of first to fourth phase tuning unit 310 to 340. This is to prevent a direct current signal from flowing from a mixer connected to the output terminals and thus prevent malfunctions of the phase tuning units 310 to 340.

Figure 3A:
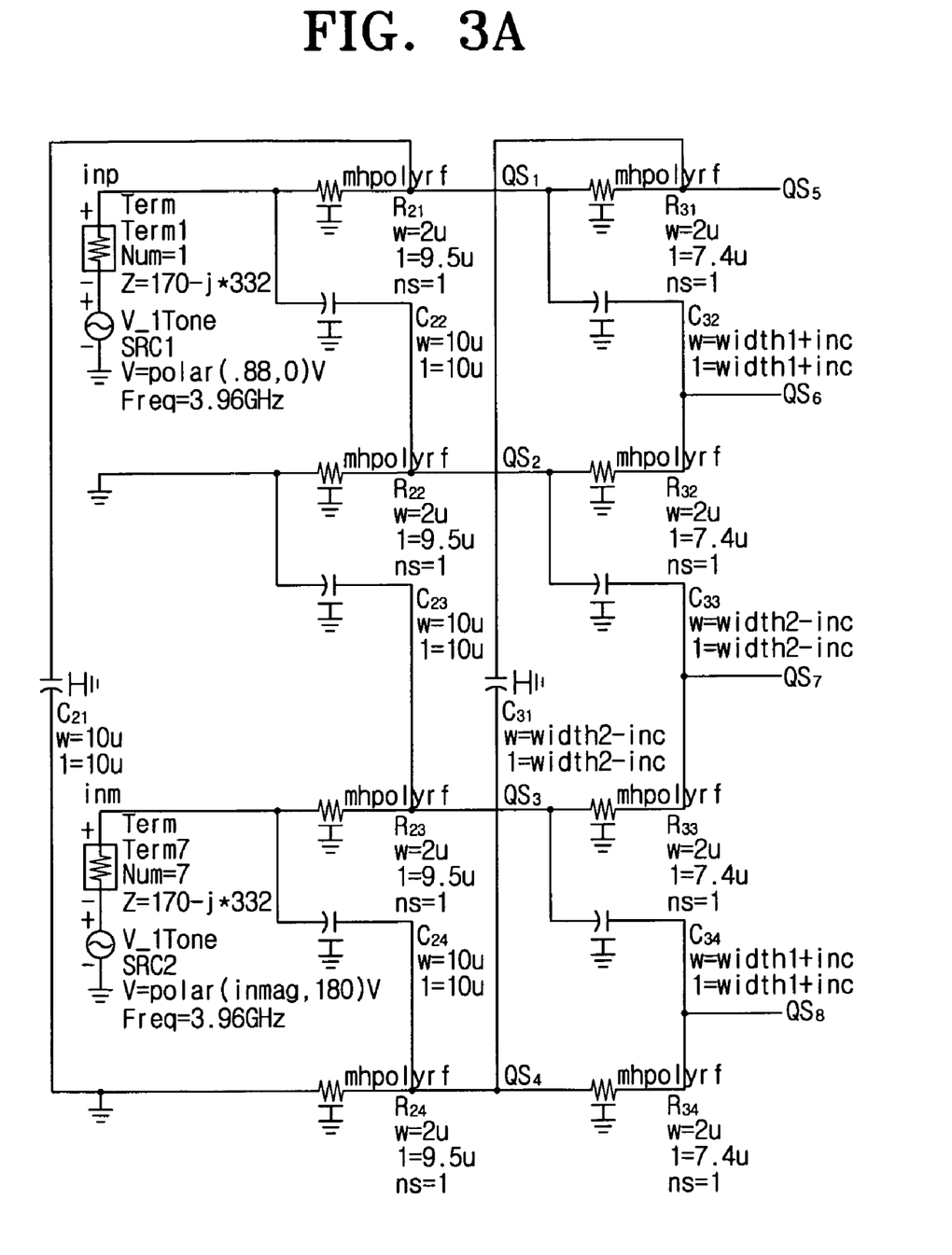
FIGS. 3A and 3B are views showing a result of computer-simulating the quadrature signal generator of FIG. 2B.
Figure 3B:
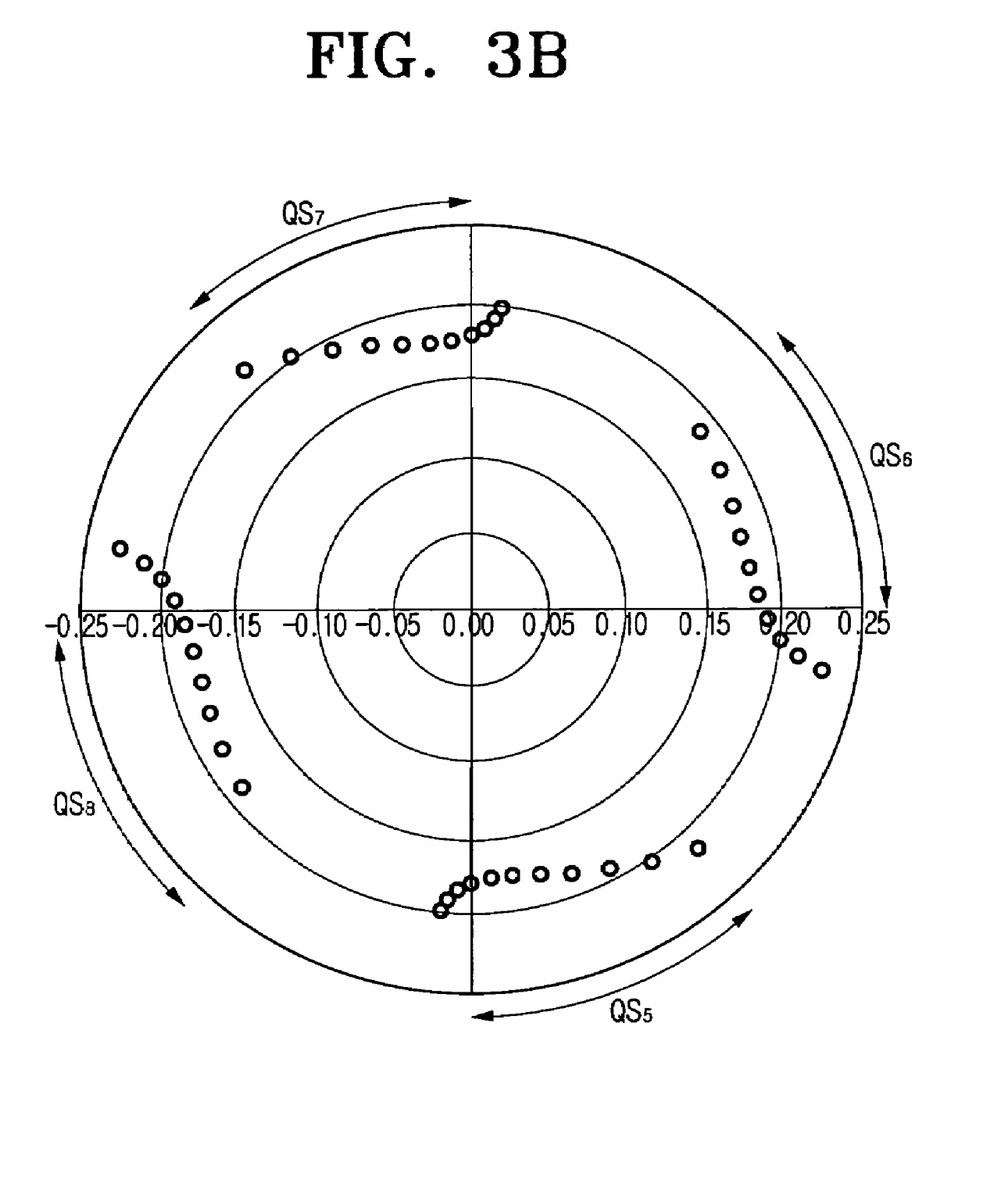

FIG. 3B is a view showing a result of computer-simulating the output quadrature signals $QS_5$, $QS_6$, $QS_7$ and $QS_8$ if the quadrature signal generator according to the present invention is constructed as shown in FIG. 3A. The phases of all of four quadrature signals are tuned by controlling the variable capacitors $C_{31}$, $C_{32}$, $C_{33}$, $C_{34}$. Also, there occurs relatively less amplitude error.

As described above, it is possible to tune all of the four generated quadrature signals. It is possible to prevent the amplitude of the quadrature signal from being deviated from a reference value.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A quadrature signal generator which generates first, second, third, and fourth quadrature signals using first and second differential signals, the quadrature signal generator comprising:
    a first phase tuning unit comprising a first input terminal which receives the first differential signal and a second input terminal, the first phase tuning unit changing a phase of the first differential signal to thereby generate the first quadrature signal;
    a second phase tuning unit comprising a first input terminal which receives the second differential signal and a second input terminal, the second phase tuning unit changing a phase of the second differential signal to thereby generate the second quadrature signal;
    a third phase tuning unit comprising a first input terminal which receives the second differential signal and a second input terminal, the third phase tuning unit changing the phase of the second differential signal to thereby generate the third quadrature signal; and
    a fourth phase tuning unit comprising a first input terminal which receives the first differential signal and a second input terminal, the fourth phase tuning unit changing the phase of the first differential signal to thereby generate the fourth quadrature signal,
    wherein the second input terminal of the first phase tuning unit, the second input terminal of the second phase tuning unit, the second input terminal of the third phase tuning unit, and the second input terminal of the fourth phase tuning unit are grounded.

2. The quadrature signal generator as claimed in claim 1, wherein
    the first phase tuning unit further comprises: a first resistor connected between the first input terminal and an output terminal which outputs the first quadrature signal; and a first variable capacitance element connected between the second input terminal and the output terminal;
    the second phase tuning unit further comprises: a second resistor connected between the second input terminal and an output terminal which outputs the second quadrature signal; and a second variable capacitance element connected between the first input terminal and the output terminal;
    the third phase tuning unit further comprises: a third resistor connected between the first input terminal and an output terminal which outputs the third quadrature signal; and a third variable capacitance element connected between the second input terminal and the output terminal outputting the third quadrature signal, and
    the fourth phase tuning unit further comprises: a fourth resistor connected between the second input terminal and an output terminal which outputs the fourth quadrature signal; and a fourth variable capacitance element connected between the first input terminal and the output terminal.

3. The quadrature signal generator as claimed in claim 2, wherein each of the first, the second, the third and the fourth variable capacitance elements comprises one of a variable capacitor and a varacter.

4. The quadrature signal generator as claimed in claim 2, wherein the output terminals of the first, the second, the third and the fourth phase tuning units are connected to direct current signal blocking elements.

5. A quadrature signal generator which generates first, second, third and fourth quadrature signals using first and second differential signals, and generates fifth, sixth, seventh and eighth quadrature signals using the first, the second, the third and the fourth quadrature signals, the quadrature signal generator comprising:
    a first phase shift unit comprising a first input terminal which receives the first differential signal and a second input terminal, the first phase shift unit changing a phase of the first differential signal to thereby generate the first quadrature signal;
    a second phase shift unit comprising a first input terminal which receives the second differential signal and a second input terminal, the second phase shift unit changing a phase of the second differential signal to thereby generate the second quadrature signal;

a third phase shift unit comprising a first input terminal which receives the second differential signal and a second input terminal, the third phase shift unit changing the phase of the second differential signal to thereby generate the third quadrature signal;

a fourth phase shift unit comprising a first input terminal which receives the first differential signal and a second input terminal, the fourth phase shift unit changing the phase of the first differential signal to thereby generate the fourth quadrature signal;

a first phase tuning unit having comprising a first input terminal which receives the first quadrature signal and a second input terminal which receives the second quadrature signal, the first phase tuning unit changing phases of the first and the second quadrature signals to thereby generate the fifth quadrature signal;

a second phase tuning unit comprising a first input terminal which receives the second quadrature signal and a second input terminal which receives the third quadrature signal, the second phase tuning unit changing phases of the second and the third quadrature signals to thereby generate the sixth quadrature signal;

a third phase tuning unit comprising a first input terminal which receives the third quadrature signal and a second input terminal which receives the fourth quadrature signal, the third phase tuning unit changing phases of the third and the fourth quadrature signals to thereby generate the seventh quadrature signal; and a fourth phase tuning unit comprising a first input terminal which receives the fourth quadrature signal and a second input terminal which receives the first quadrature signal, the fourth phase tuning unit changing phases of the fourth and the first quadrature signals to thereby generate the eighth quadrature signal, wherein the second input terminal of the first phase shift unit, the second input terminal of the second phase shift unit, the second input terminal of the third phase shift unit, and the second input terminal of the fourth phase shift unit are grounded.

6. The quadrature signal generator as claimed in claim 5, wherein the first phase shift unit further comprises: a first resistor connected between the first input terminal and an output terminal which outputs the first quadrature signal; and a first capacitor connected between the second input terminal and the output terminal, the second phase shift unit further comprises: a second resistor connected between the second input terminal and an output terminal which outputs the second quadrature signal; and a second capacitor connected between the first input terminal and the output terminal, the third phase shift unit further comprises: a third resistor connected between the first input terminal and an output terminal which outputs the third quadrature signal; and a third capacitor connected between the second input terminal and the output terminal, and the fourth phase shift unit further comprises: a fourth resistor connected between the second input terminal and an output terminal which outputs the fourth quadrature signal; and a fourth capacitor connected between the first input terminal and the output terminal.

7. The quadrature signal generator as claimed in claim 5, wherein the first phase tuning unit further comprises: a fifth resistor connected between the first input terminal and an output terminal which outputs the fifth quadrature signal; and a first variable capacitance element connected between the second input terminal and the output terminal, the second phase tuning unit further comprises: a sixth resistor connected between the first input terminal and an output terminal which outputs the sixth quadrature signal; and a second variable capacitance element connected between the second input terminal and the output terminal, the third phase tuning unit further comprises: a seventh resistor connected between the first input terminal and an output terminal which outputs the seventh quadrature signal; and a third variable capacitance element connected between the second input terminal and the output terminal, and the fourth phase tuning unit further comprises: an eighth resistor connected between the first input terminal and an output terminal which outputs the eighth quadrature signal; and a fourth variable capacitance element connected between the second input terminal and the output terminal.

8. The quadrature signal generator as claimed in claim 7, wherein each of the first, the second, the third, and the fourth variable capacitance elements comprises one of a variable capacitor and a varacter.

9. The quadrature signal generator as claimed in claim 7, wherein the output terminals of the first, the second, the third, and the fourth phase tuning units are connected to direct current signal blocking elements.

* * * * *